United States Patent
Wong et al.

(10) Patent No.: US 7,058,858 B2
(45) Date of Patent: Jun. 6, 2006

(54) SYSTEMS AND METHODS FOR PROVIDING AUTOMATED DIAGNOSTIC SERVICES FOR A CLUSTER COMPUTER SYSTEM

(75) Inventors: Joseph D. Wong, Roseville, CA (US); Peter A. Put, Edmonton (CA)

(73) Assignee: Hewlett-Packard Development Company, L.P., Houston, TX (US)

(*) Notice: Subject to any disclaimer, the term of this patent is extended or adjusted under 35 U.S.C. 154(b) by 977 days.

(21) Appl. No.: 10/005,555

(22) Filed: Oct. 26, 2001

(65) Prior Publication Data

US 2002/0178396 A1 Nov. 28, 2002

Related U.S. Application Data

(63) Continuation-in-part of application No. 09/840,784, filed on Apr. 23, 2001.

(51) Int. Cl.
*G06F 11/00* (2006.01)

(52) U.S. Cl. .......................................... 714/42; 714/48

(58) Field of Classification Search .................. 714/42, 714/48, 43
See application file for complete search history.

(56) References Cited

U.S. PATENT DOCUMENTS

| | | | | | |
|---|---|---|---|---|---|
| 5,546,535 | A | * | 8/1996 | Stallmo et al. | 714/9 |
| 5,761,410 | A | * | 6/1998 | Martin et al. | 714/42 |
| 5,822,531 | A | * | 10/1998 | Gorczyca et al. | 709/221 |
| 5,835,703 | A | * | 11/1998 | Konno | 714/42 |
| 6,151,688 | A | * | 11/2000 | Wipfel et al. | 714/48 |
| 6,343,324 | B1 | * | 1/2002 | Hubis et al. | 709/229 |
| 6,438,586 | B1 | * | 8/2002 | Hass et al. | 709/213 |
| 6,493,729 | B1 | * | 12/2002 | Gusler et al. | 707/204 |
| 2003/0051191 | A1 | * | 3/2003 | Circenis et al. | 714/25 |
| 2003/0093721 | A1 | * | 5/2003 | King et al. | 714/42 |

* cited by examiner

*Primary Examiner*—Bryce P. Bonzo

(57) ABSTRACT

Systems and methods for providing automated diagnostic services for a cluster computer system are provided. One of many possible embodiments is a method for providing automated diagnostic services for a cluster computer system comprising a plurality of nodes. Each of the plurality of nodes may provide an application to a plurality of clients. Briefly described, one such method comprises the steps of: receiving information related to a plurality of drives associated with the plurality of nodes in the cluster computer system, the drives defining one or more logical volume groups; based on the information related to the drives, determining whether the drives conform to a predefined condition related to failover capability such that the one or more logical volume groups transition in the event of a failover; and, if the drives do not conform to the predefined condition, providing a warning.

59 Claims, 11 Drawing Sheets

| NODE 502 | CPU 504 | RAM 506 | Swap 508 | Disk 510 | Net Card 512 | O/S Rev 514 | Patch 516 | Apps 518 | Users 520 | Cluster S/W 522 |
|---|---|---|---|---|---|---|---|---|---|---|
| NODE 1 | A | A | B | B | A | C | A | B | B | U |
| NODE 2 | A | A | B | B | C | C | A | B | B | B |
| NODE 3 | A | A | A | B | B | A | B | A | A | A |
| NODE 4 | A | A | A | A | B | A | B | B | C | U |
| NODE 5 | A | A | B | B | A | C | A | B | B | B |
| NODE 6 | A | A | B | B | A | C | A | B | B | B |

(A) Conforms, (B) Warning, (C) Issue; (U)nknown

FIG. 5

SYSTEMS AND METHODS FOR PROVIDING AUTOMATED DIAGNOSTIC SERVICES FOR A CLUSTER COMPUTER SYSTEM

CROSS-REFERENCE TO RELATED APPLICATIONS

This application is a continuation-in-part of copending U.S. utility application entitled, "Systems and Methods for Providing an Automated Diagnostic Audit for Cluster Computer Systems," having Ser. No. 09/840,784, and filed Apr. 23, 2001, which is hereby incorporated in its entirety by reference. This application is also related to copending, and concurrently-filed, U.S. utility application entitled "Systems and Methods for Providing Automated Diagnostic Services for a Cluster Computer System," having Ser. No. 10/008,855, and filed Oct. 26, 2001, which is hereby incorporated by reference in its entirety.

TECHNICAL FIELD

The present invention is generally related to cluster computing systems, and more particularly, is related to providing diagnostic audits for cluster computer systems.

BACKGROUND OF THE INVENTION

Within the computing industry, there is an ongoing demand for information technology (IT) solutions that provide cost-effective, flexible, and fault-tolerant software applications to multiple computer users within a cluster computer system. A cluster computer system typically refers to a collection of computers, servers, or workstations interconnected via a communications network for the purpose of reliably providing a mission-critical software application to clients supported by the collection of computers, servers, or workstations. In general, the computers that comprise a cluster computer system work collectively as an integrated computing resource to provide the mission-critical software application. Cluster middleware is designed to protect the cluster computer system from a wide variety of hardware and software failures that may affect the provisioning of the mission-critical software application. For example, cluster middleware is responsible for providing what is referred to in the art as a Single System Image (SSI) of the cluster computer system by ensuring that the resources on computer A will be available on computer B in the event of some hardware or software failure related to computer A. In other words, the cluster middleware glues together the operating systems of each computer within the cluster computer system to offer reliable access to the mission-critical software application. Typically, cluster middleware performs a variety of tasks related to the cluster computer system, such as, for example, checkpointing, automatic failover, recovery from failure, and fault-tolerant support among all of the computers in the cluster computer system.

Notwithstanding the existence of robust cluster middleware, there is also a substantial demand in the cluster computer system environment for diagnostic tools and services for monitoring the consistency and operational capability of the cluster computer system. Currently, diagnostic services for cluster computer systems are performed manually by service personnel. For example, service personnel have to first run a series of data collection tools to gather data related to the cluster computer system. In situations where different computers within the cluster computer system have different operating systems, the data collection tools typically have to be performed for each type of operating system. After the data related to the cluster computer system is collected, the service personnel have to perform a manual analysis of the data to ensure that there is consistency between the corresponding computers for each type of operating system. This manual analysis may be extremely time-consuming and expensive, and because the analysis is manual, the diagnostic service is susceptible to error and variations between personnel performing the analysis. Furthermore, manual analysis becomes increasingly problematic as the number of computers in the cluster computer system increases. As more and more data is gathered by the collection tools, it becomes increasingly difficult for service personnel to perform a meaningful diagnostic audit. For instance, instead of proactively providing meaningful diagnostic information by comparing the relative consistency of each computer within the cluster computer system, service personnel are confined to reactively explaining the differences between various computers within the cluster computer system.

Thus, there is a need in the industry to address these deficiencies and inadequacies.

SUMMARY OF THE INVENTION

The present invention provides systems and methods for providing automated diagnostic services for a cluster computer system.

One of many possible embodiments is a method for providing automated diagnostic services for a cluster computer system comprising a plurality of nodes. Each of the plurality of nodes may provide an application to a plurality of clients. Briefly described, one such method comprises the steps of: receiving information related to a plurality of drives associated with the plurality of nodes in the cluster computer system, the drives defining one or more logical volume groups; based on the information related to the drives, determining whether the drives conform to a predefined condition related to failover capability such that the one or more logical volume groups transition in the event of a failover; and, if the drives do not conform to the predefined condition, providing a warning.

The present invention may also be viewed as providing a computer program for providing automated diagnostic services for a cluster computer system. Briefly described, one such computer program may comprise: a first portion of logic configured to receive information related to a plurality of drives associated with the plurality of nodes in the cluster computer system, the drives defining one or more logical volume groups; a second portion of logic configured to determine, based on the information related to the drives, whether the drives conform to a predefined condition related to failover capability such that the one or more logical volume groups transition in the event of a failover; and a third portion of logic configured to provide a warning if the drives do not conform to the predefined condition.

The present invention may also be viewed as a system for providing automated diagnostic services for a cluster computer system. Briefly described, one such system may comprise a computer having logic configured to: receive information related to a plurality of drives associated with a plurality of nodes in the cluster computer system, the drives defining one or more logical volume groups; determine, based on the information related to the drives, whether the drives conform to a predefined condition related to failover capability such that the one or more logical volume groups transition in the event of a failover; and provide a warning if the drives do not conform to the predefined condition.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 5 illustrates one of a number of possible embodiments of a cluster audit display generated from the information provided by the automated cluster audit system of FIGS. 1 and 2.

DETAILED DESCRIPTION OF THE PREFERRED EMBODIMENT

I. System Overview

Figure 1:
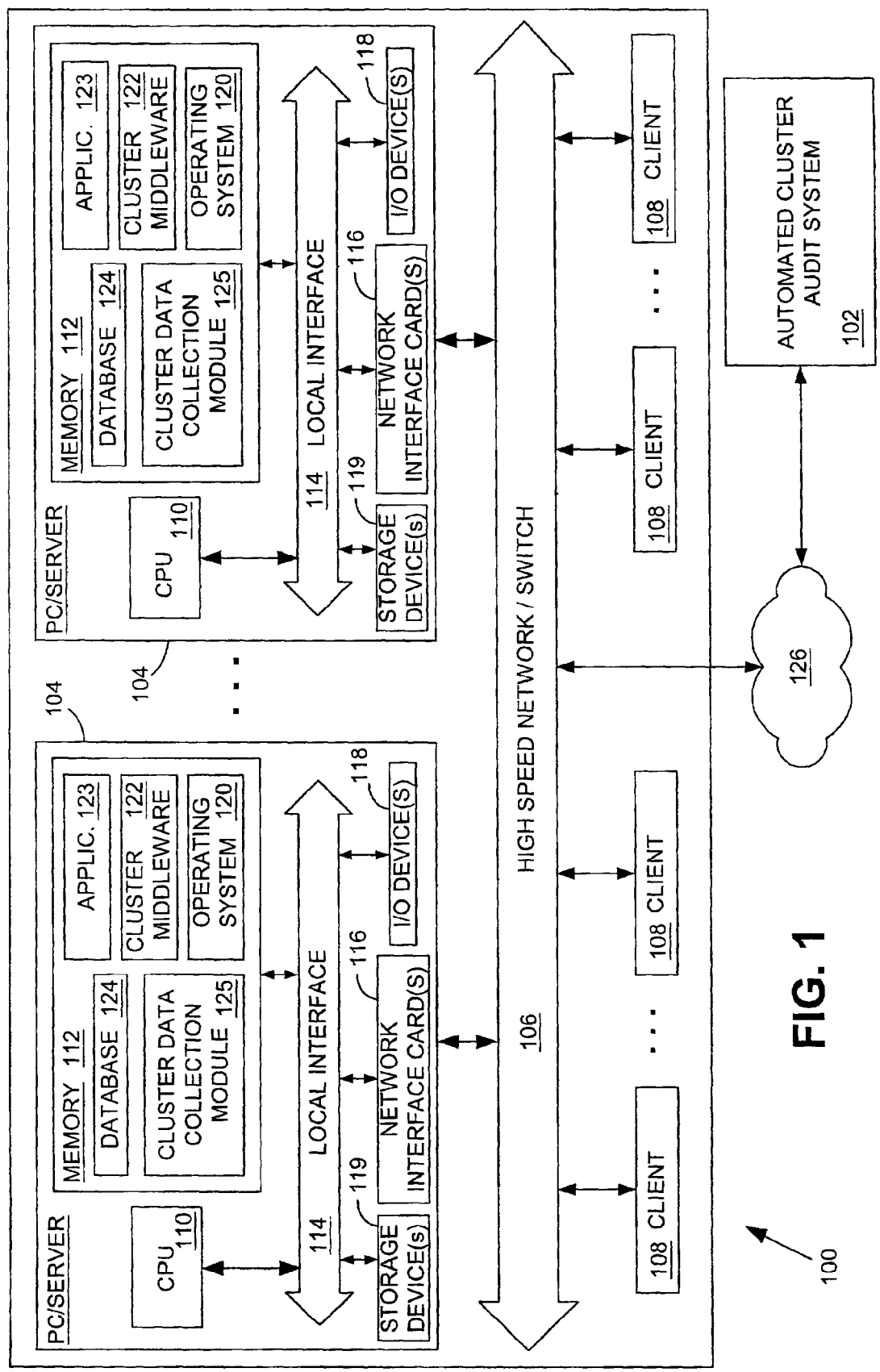
FIG. 1 is a block diagram of a cluster computer system and one of a number of possible embodiments of an automated cluster audit system according to the systems and methods of the present invention.

FIG. 1 is a block diagram of a cluster computer system 100 and one of a number of possible embodiments of an automated cluster audit system 102 according to the systems and methods of the present invention for providing an automated diagnostic audit of cluster computer system 100. Cluster computer system 100 comprises a plurality of nodes 104 interconnected via a local cluster interface 106. Local cluster interface 106 may be a communication network, such as, for example, a local area network (LAN), a metropolitan area network (MAN), a wide area network (WAN), or any other type of communication network employing any network topology, transmission medium, or network protocol. In other embodiments, local cluster interface 106 may be a switch.

Each node 104 communicates with a plurality of clients 108 via any type of communication network, such as, for example, local cluster interface 106. In general, cluster computer system 100 operates as a single computing resource for delivering an application, such as, a mission-critical or time-critical computer application. Nonlimiting examples of such mission-critical or time-critical computer applications include: Apache Web Server, Oracle Parallel Server Database, Peoplesoft Human Resource Management Software, SAP Supply Chain Management Software.

Nodes 104 may be any single or multiprocessor computer system, such as, for example, a personal computer (PC), server, a workstation, or any other similar system based on any type of computer architecture. In other embodiments, nodes 104 may themselves be clusters of PCs, servers, or workstations. Cluster computer system 100 may also support a number of node configurations. For example, in some embodiments, cluster computer system 100 may be a homogeneous cluster in which each node 104 has a similar computer architecture and a similar operating system. In other embodiments, cluster computer system 100 may be a heterogeneous cluster in which different nodes 104 have different computer architectures and different operating systems.

Nodes 104 may comprise a central processing unit (CPU) 110, memory 112, local interface 114, a network interface card(s) 116, input/output (I/O) device(s) 118, and storage device(s) 119. CPU 110 may be based on any of a number of processor architectures, including, for example, RISC, CISC, VLIW, and Vector. Memory 112 may comprise an operating system 120, cluster middleware 122, applications 123, database 124, and cluster data collection module 125. Operating system 120 may be any operating system. For example, in certain embodiments, operating system 120 may be any preemptive multi-tasking operating system that permits networked file locking, such as, BeOS, MPE/iX, Unix, and variants of Unix, such as AIX, BSD, Linux, SCO Unix, Solaris, SunOS, HP-UX and Ultrix. In other embodiments, operating system 120 may be an operating system such as OS/2, Windows, or Windows NT. As described in more detail below, cluster data collection module 125 may be used to collect a variety of types of information associated with cluster computer system 100.

Cluster middleware 122 may be any middleware layer that resides between operating system 120 and applications 123. Cluster middleware 122 provides what is referred to in the art as a Single System Image (SSI) of cluster computer system 100. In general, cluster middleware 122 glues together operating systems 120 on all nodes 104 in cluster computer system 100 to offer unified access to applications 123. As known in the art, cluster middleware 122 may provide any of the following, and other, cluster services: checkpointing, automatic failover, recovery from failure, and fault-tolerant support among all nodes 104. In a preferred embodiment, cluster middleware 122 is Hewlett-Packard's "Multi-computer ServiceGuard." In other embodiments, cluster middleware 122 may be Beowulf for Linux, Microsoft Cluster Server (referred to as Wolfpack) for Windows or WindowsNT, or any other cluster middleware for providing any of a variety of cluster services.

As stated above, applications 123 may comprise at least one parallel application, which may be any mission-critical or time-critical computer application that needs to be reliably provided to all nodes 104 and clients 108 in cluster computer system 100, such as, Apache Web Server, Oracle Parallel Server Database, Peoplesoft Human Resource Management Software, and SAP Supply Chain Management Software to name a few. Applications 123 may also comprise any of a number of scalar computer applications that operate independently of cluster middleware 122.

As one of ordinary skill in the art understands, there are numerous embodiments for cluster computer system 100. For example, depending on the specific implementation of cluster computer system 100, nodes 104 may include multiple CPUs 110, multiple I/O devices 118, multiple interface cards 116, multiple storage devices 119, or other components not illustrated in FIG. 1.

As illustrated in FIG. 1, cluster computer system 100 may be connected to automated cluster audit system 102 via public or private packet-switched or other data networks including the Internet, circuit switched networks such as the public switched telephone network, wireless networks, optical networks, or any other desired communications infrastructure 126.

II. System Components and Operation

Figure 2:
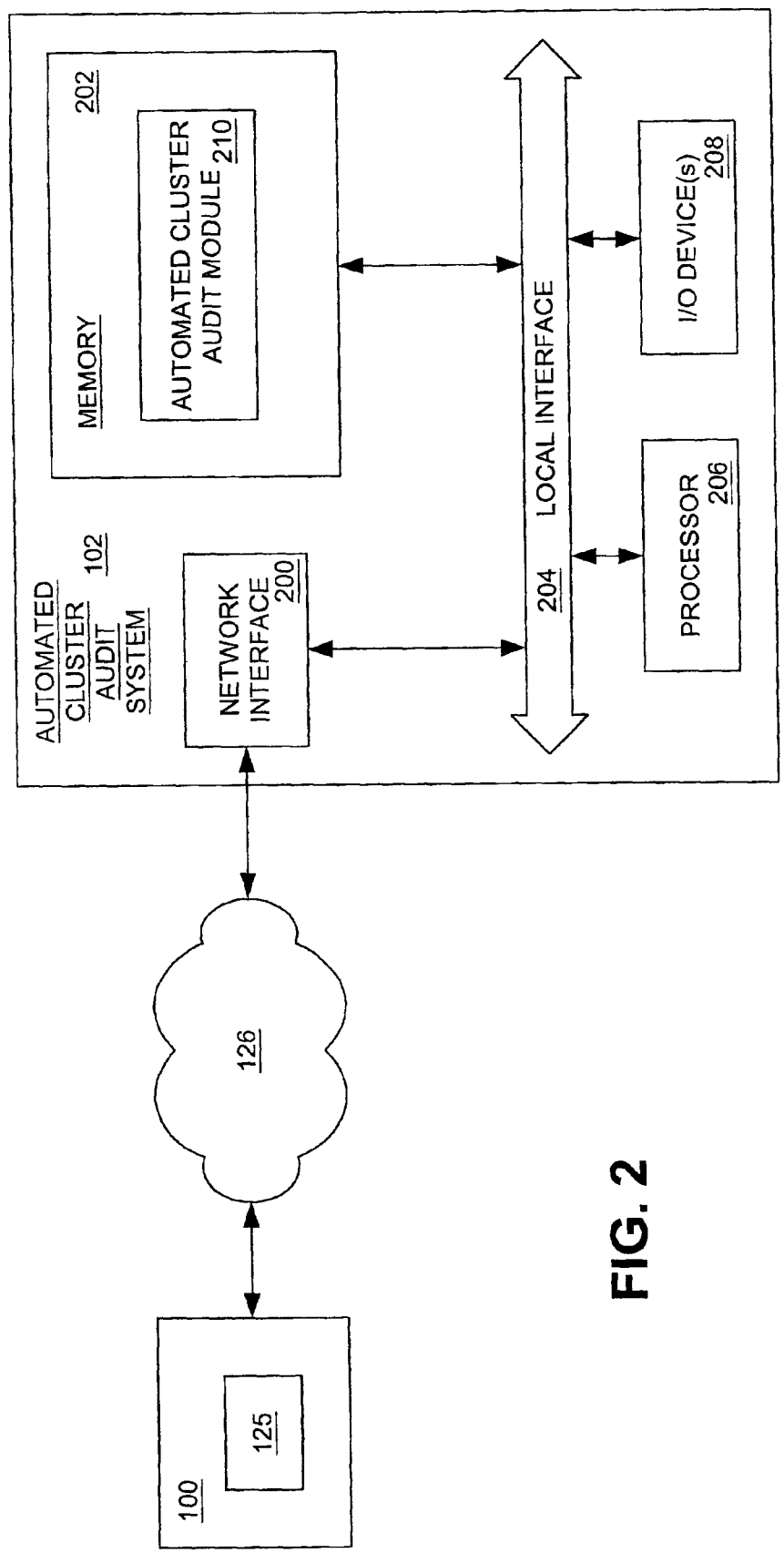
FIG. 2 is a block diagram of the automated cluster audit system of FIG. 1.

FIG. 2 illustrates a block diagram of cluster computer system 100 and automated cluster audit system 102 of FIG. 1. Automated cluster audit system 102 may generally comprise a network interface 200, memory 202, local interface 204, a processor 206, and I/O device(s) 208. Network interface 200 communicates with communication infrastructure 126 and local interface 204. As known by those of ordinary skill in the art, network interface 200 may be implemented in any of a variety of ways depending on the configuration of communications infrastructure 126 and cluster computer system 100. Local interface 204 also connects memory 202, processor 206, and I/O device(s) 208. Memory 202 includes automated cluster audit module 210. As will be described in more detail below, automated cluster audit module 210 may be used to provide a variety of automated diagnostic services for cluster computer system 100.

Figure 3:
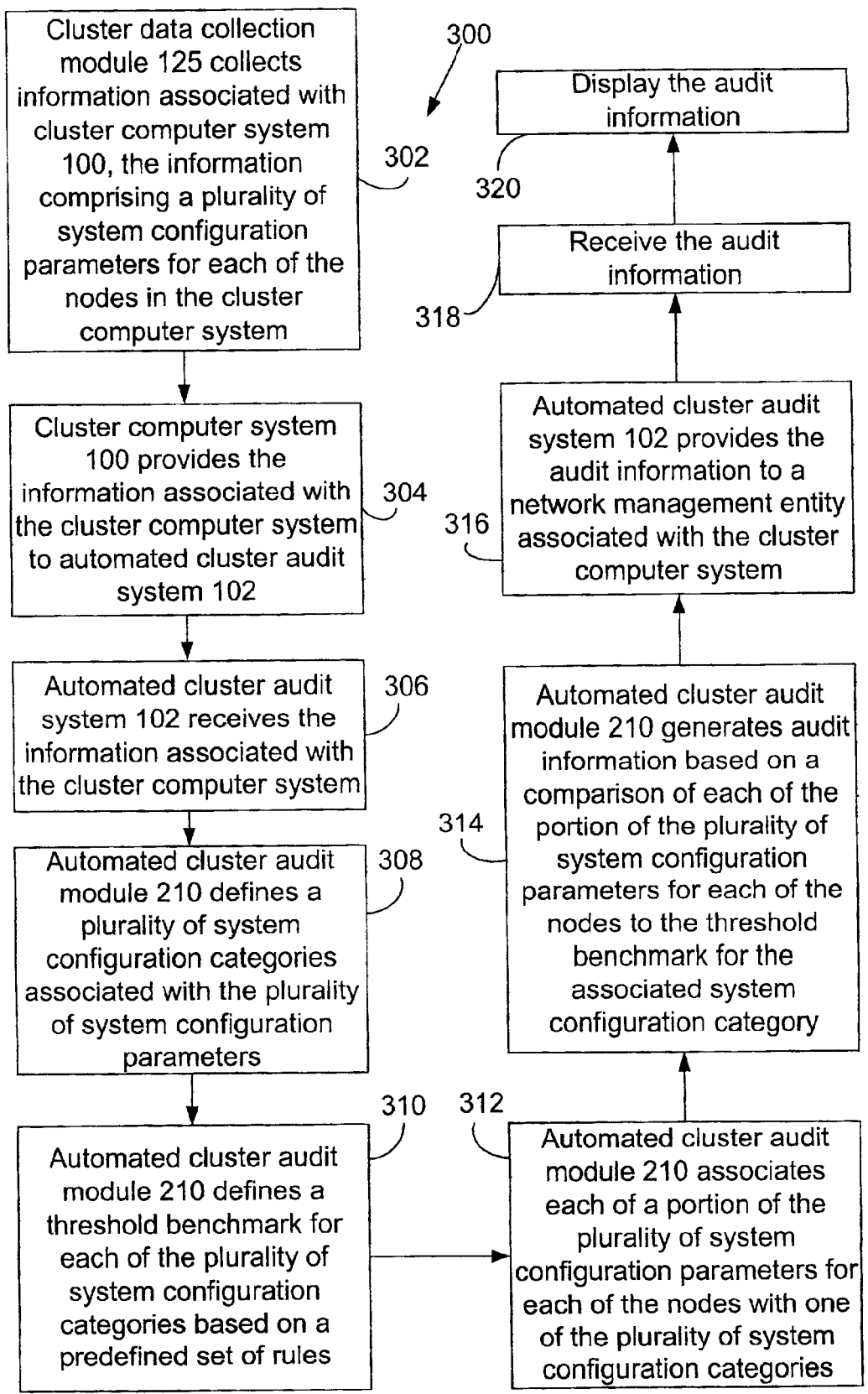
FIG. 3 is a flow chart illustrating the general operation of, and interaction between, the automated cluster audit system and cluster computer system of FIGS. 1 and 2.

FIG. 3 is a flow chart 300 illustrating the general operation of, and interaction between, automated cluster audit system 102 and cluster computer system 100 of FIGS. 1 and 2. At block 302, cluster data collection module 125 collects information associated with cluster computer system 100. The information may comprise a plurality of system configuration parameters for each node 104 in cluster computer system 100. In general, the system configuration parameters define a snapshot of the configuration of each node 104. For example, the system configuration parameters may include information related to CPU 110, operating system 120, cluster middleware 122, applications 123, database 124, network interface card(s) 116, I/O device(s) 118, clients 108, storage device(s) 119, or any other desirable parameter related to the system configuration of node 104.

Unlike existing prior art cluster data collection tools, which focus on maximizing computing efficiency by eliminating redundancy, cluster data collection module 125 may be configured to provide redundant data collection. For instance, cluster data collection module 125 may employ an aggregation of known cluster data collection tools, such as commercial off-the-shelf (COTS) tools, proprietary data collection tools, or any other data collection tool, to collect the information associated with cluster computer system 100. In a preferred embodiment, cluster data collection module 125 may be configured so that the aggregated list of collectible items includes redundant items. For example, one known data collection tool may collect system configuration parameters A, B, C, and D, and another known data collection tool may collect system configuration parameters B, C, D, E, and F. In this manner, cluster data collection module 125 may redundantly collect and record system configuration parameters B, C, and D. This enables automated cluster audit system 102 to employ error correction techniques for the redundant system configuration parameters. Therefore, if there is a failure or an error with respect to system configuration parameter B that is collected by the first data collection tool, the system configuration parameter B collected by the second data collection tool may be used by automated cluster audit system 102 to provide a more reliable diagnostic audit.

After collecting the information, at block 304, cluster computer system 100 may provide the information to automated cluster audit system 102 via communications infrastructure 126. The information exchange between cluster computer system 100 and automated cluster audit system 102 may be done in a variety of ways. For example, the information may be provided to automated cluster audit system 102 via electronic mail or any other transport media, such as, file transfer protocol (FTP), hypertext transfer protocol (HTTP), or any other protocol. In certain embodiments, the information exchange between cluster computer system 100 and automated cluster audit system 102 is performed as disclosed in U.S. Pat. No. 6,192,410 B1 to Miller et al., which is hereby incorporated by reference in its entirety.

After receiving the information at block 306, automated cluster audit system 102 may perform a variety of functions in order to provide an automated diagnostic audit of the information received from cluster computer system 100. At block 308, automated cluster audit module 210 may define a plurality of system configuration categories associated with the plurality of system configuration parameters for each node 104 of cluster computer system 100.

At block 310, automated cluster audit module 210 may also define a threshold benchmark for each of the plurality of system configuration categories based on a predefined set of rules. For example, the threshold benchmarks may be normalized thresholds or fixed thresholds that incorporate a relative ranking process. Where normalized thresholds are implemented, the threshold benchmarks may be defined using a predefined rule that oversees the relative ranking process on a distribution of historical peer-to-peer data. The historical peer-to-peer data may be generated by automated cluster audit system 102. It may also be generated by an external system and provided to automated cluster audit system 102.

Regardless of how the data is generated, in certain embodiments, the central ranking distribution system enables automated cluster audit module 210 to adjust the threshold benchmarks. This process of relying upon a central predetermined ranking distribution system for adjusting thresholds overcomes various problems. For example, absolute fixed thresholds are subject to an unpredictable number of unmanaged or ad hoc number of false negatives and false positives. Assuming the benchmarks or heuristic measures are correct, a fixed ranking distribution will produce a controlled percentage of alarms within a fixed population that address the correct categories. Absolute thresholds that are dynamically adjusted with local standards tend to produce confusing results unless time series data samples are gathered over a period of time so that baselining is possible.

Manually adjustable thresholds require significant attentive human operator labor to calibrate thresholds to arbitrary values.

Furthermore, at block 312, automated cluster audit module 210 may associate each of a portion of the plurality of system configuration parameters for each node 104 with one of the plurality of system configuration categories. At block 314, audit information is generated based on a comparison of each of the portion of the plurality of system configuration parameters for each node 104 to the threshold benchmark for the associated system configuration category. At block 316, automated cluster audit system 102 may provide the audit information to a network management entity, or similar entity, associated with cluster computer system 100. After receiving the audit information at 318, cluster computer system 100 may then display the audit information at block 320.

It should be understood by those of ordinary in the art that there are numerous ways to implement automated cluster audit system 102. For instance, as illustrated in FIGS. 1 and 2, automated cluster audit system 102 may be leveraged in an application service provider (ASP) environment. In these embodiments, cluster computer systems 100 may subscribe to the services provided by automated cluster audit system 102. In this manner, information associated with a cluster computer system 100 and collected by cluster data collection module 125, such as described above, may be periodically provided to automated cluster audit system 102 when a diagnostic audit is desired. In response to the request for a diagnostic audit, automated cluster audit system 102 may then provide the diagnostic information. The diagnostic information may be provided directly to cluster computer system 100 or to some network management entity, or similar entity, affiliated with cluster computer system 100.

In alternative embodiments, automated cluster audit system 102 may be integrated with cluster data collection module 125 and/or operating system 120 in cluster computer systems 100. In these embodiments, instead of providing the information associated with cluster computer system 100 to an external system, the functionality of automated cluster audit module 210 may be included within cluster computer system 100. For example, the functionality of automated cluster audit module 210 may be implemented in memory 112, or some other memory, in nodes 104 and executed by CPU 110. Although cluster data collection module 125 and automated cluster audit module 210 may be employed in all of these, and other possible embodiments, for clarity they will be described with reference to FIGS. 1 and 2.

III. Cluster Data Collection Module

Figure 4:
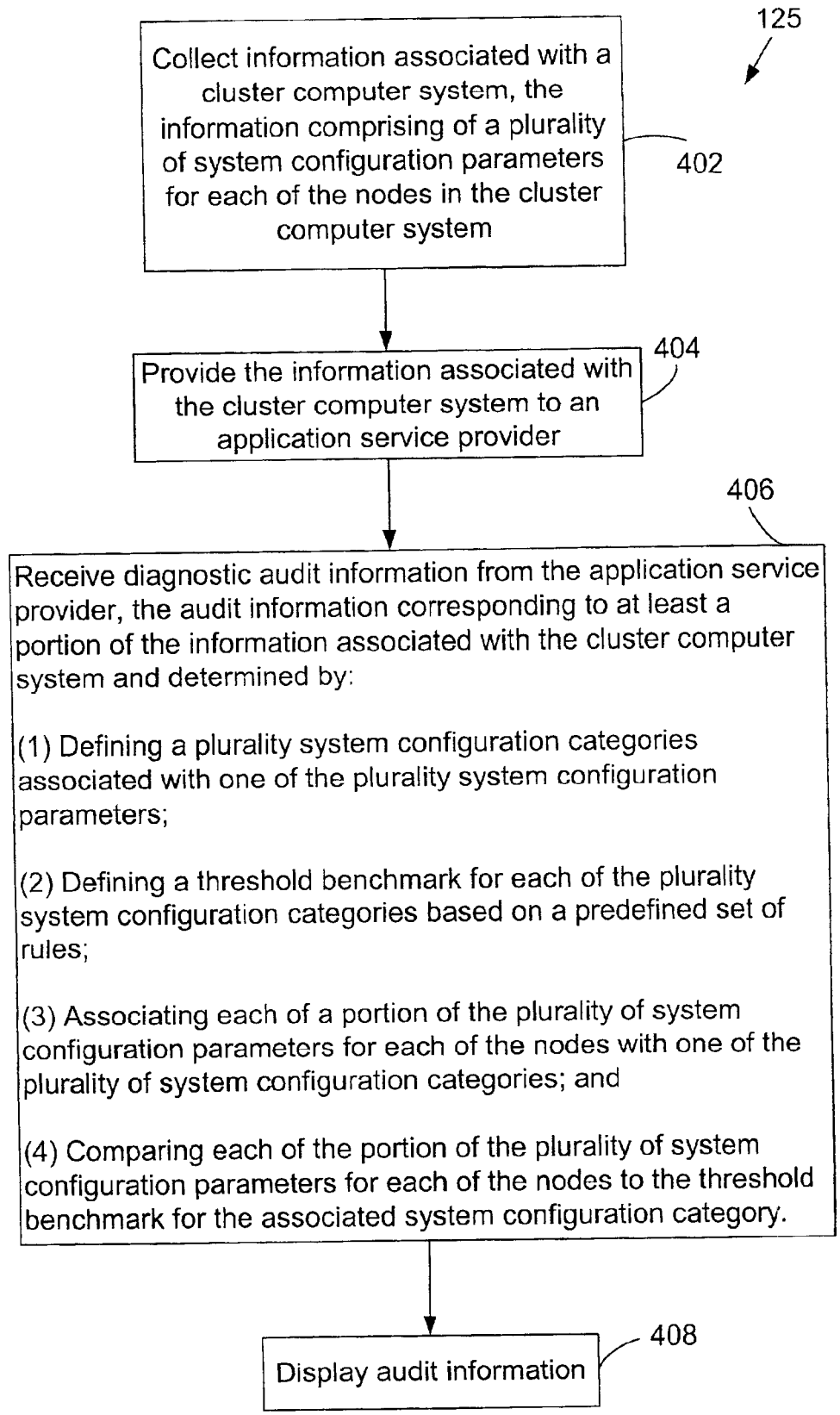
FIG. 4 is a flow chart illustrating the architecture, operation, and/or functionality of one of a number of possible embodiments of the cluster data collection module of FIGS. 1 and 2.

FIG. 4 is a flow chart illustrating the architecture, operation, and/or functionality of cluster data collection module 125 of FIGS. 1 and 2. At block 402, cluster data collection module 125 collects information associated with cluster computer system 100. The information may comprise a plurality of system configuration parameters for each node 104 in cluster computer system 100. In general, the system configuration parameters define a snapshot of the configuration of each node 104. For example, the system configuration parameters may include information related to CPU 110, operating system 120, cluster middleware 122, applications 123, database 124, network interface card(s) 116, I/O device(s) 118, clients 108, storage device(s) 119, or any other desirable parameter related to the system configuration of node 104.

Unlike existing prior art cluster data collection tools, which focus on maximizing computing efficiency by eliminating redundancy, cluster data collection module 125 may be configured to provide redundant data collection. For instance, cluster data collection module 125 may employ an aggregation of known cluster data collection tools, such as commercial off-the-shelf (COTS) tools, proprietary data collection tools, or any other data collection tool, to collect the information associated with cluster computer system 100. In a preferred embodiment, cluster data collection module 125 may be configured so that the aggregated list of collectible items includes redundant items. For example, one known data collection tool may collect system configuration parameters A, B, C, and D, and another known data collection tool may collect system configuration parameters B, C, D, E, and F. In this manner, cluster data collection module 125 may redundantly collect and record system configuration parameters B, C, and D. This enables automated cluster audit system 102 to employ error correction techniques for the redundant system configuration parameters. Therefore, if there is a failure or an error with respect to system configuration parameter B that is collected by the first data collection tool, the system configuration parameter B collected by the second data collection tool may be used by automated cluster audit system 102 to provide a more reliable diagnostic audit.

At block 404, cluster data collection module 125 provides the information associated with cluster computer system 100 to automated cluster audit system 102 via communications infrastructure 126. The information associated with cluster computer system 100 may be provided to automated cluster audit system 102 in a variety of ways. For example, the information may be provided to automated cluster audit system 102 via electronic mail or any other transport media, such as, file transfer protocol (FTP), hypertext transfer protocol (HTTP), or any other protocol. In certain embodiments, the information associated with cluster computer system 100 may be provided to automated cluster audit system 102 in the manner disclosed in U.S. Pat. No. 6,192,410 B1 to Miller et al.

At block 406, cluster data collection module 125 receives diagnostic audit information related to the information associated with cluster computer system 100 that is provided to automated cluster audit system 102. The diagnostic audit information corresponds to at least a portion of the information associated with the cluster computer system 100. Furthermore, the diagnostic audit information may be determined by (1) defining a plurality of system configuration categories associated with the plurality of system configuration parameters, (2) defining a threshold benchmark for each of the plurality of system configuration categories based on predefined set of rules, (3) associating each of a portion of the plurality of system configuration parameters for each node 104 with one of the plurality of system configuration categories, and (4) comparing each of the portion of the plurality of system configuration parameters for each node 104 to the threshold benchmark for the associated system configuration category. At block 408, cluster data collection module 125 displays the diagnostic audit information.

Cluster data collection module 125 may be implemented in hardware, software, firmware, or a combination thereof. As illustrated in FIG. 1, in one of a number of possible embodiments, cluster data collection module 125 is implemented in software or firmware that is stored in memory and that is executed by processor or any other suitable instruction execution system. If implemented in hardware, as in alternative embodiments, cluster data collection module 125 may be implemented with any or a combination of the following technologies, which are all well known in the art:

a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

FIG. 5 illustrates one of a number of possible embodiments of a cluster audit display 500 generated by cluster data collection module 125 from the diagnostic audit information provided by automated cluster audit system 102. Cluster audit display 500 is a table that includes a Node Name column 502. Column 502 lists vertically each node 104 in cluster computer system 100. Cluster audit display 500 also includes a CPU column 504, a RAM column 506, a Swap column 508, a Disk column 510, a Network Card column 512, an Operating System column 514, a Patch column 516, an Apps column 518, a Users column 520, and a Cluster S/W column 522. Columns 504, 506, 508, 510, 512, 514, 516, 518, 520, and 522 correspond to the system configuration categories defined by automated audit cluster system 102 (block 308, FIG. 3 and block 602, FIG. 6). Thus, audit information for each node 104 may be viewed horizontally across the corresponding row. In this manner, the diagnostic metrics for each node 104 in cluster computer system 100 may be sorted, for example, horizontally along a hierarchical scale such that each node 104 within cluster computer system 100 can be compared to every other node 104 in cluster computer system 100.

Furthermore, cluster audit display 500 may also present the sorted diagnostic metrics for cluster computer system 100 in the form of a comparison against threshold benchmarks for each of the system configuration categories. The threshold benchmarks may be defined by automated cluster audit system 102 based on a predefined set of rules (block 310, FIG. 3 and block 604, FIG. 6). In certain embodiments, the predefined set of rules may comprise various heuristic formulas related to each system configuration category.

For example, referring again to FIG. 5, the threshold benchmarks for the system configuration category associated with CPU column 504 may be defined based on predefined rules related to, for example, processor frequency, processor utilization, hardware architecture, estimated instructions per cycle, and any other desirable variable. The threshold benchmarks for the system configuration category associated with Disk column 510 may be defined based on predefined rules related to, for example, shared drive configurations, appropriate redundant array of inexpensive disks (RAID) settings, multiple disk controller cards, or any other desirable variable. The threshold benchmarks for the system configuration category associated with Net Card column 512 may be defined based on predefined rules related to, for example, network interface cards or any other desirable variable. The threshold benchmarks for the system configuration category associated with O/S Rev column 514 may incorporate major (integer) and minor (fractional) variances in the O/S release number and O/S word length or bit width variances associated with operating system 120. For example, the predefined rules may convert alphabetical characters with rightmost characters in a finite version string into an arbitrary precision number. The predefined rules may transform the most significant digits on the left and leftmost characters into least significant digits. In this manner, nodes 104 with an operating system 120 having an integer difference in the release number may be associated with one conformance state, such as, "Issue." Nodes 104 with an operating system 120 having a fractional difference in the release number may be associated with another conformance state, such as, "Warning."

Furthermore, the threshold benchmarks for the system configuration category associated with Patch column 516 may be defined based on predefined rules related to, for example, service packs, patches, patch bundles, service modifications, bug fix changes, or any other desirable variable. The threshold benchmarks for the system configuration category associated with Apps column 518 may be defined based on predefined rules which incorporate a list of applications that are known to impair the reliability of a computer. This list of applications may be included in a defect tracking database. The threshold benchmarks for the system configuration category associated with Cluster S/W column 522 may be defined based on predefined rules related to any of a variety of variables. For example, automated cluster audit module 210 may verify the installation and configuration of cluster middleware 122 settings, test the version numbers for cluster middleware 122, and check the operation status of each cluster middleware setting with the context of the cluster.

The predefined set of rules may also comprise statistical segmentation guidelines for determining various conformance states. Automated cluster audit system 102 compares the system configuration parameters for each node 104 to the threshold benchmarks for the associated system configuration category. Based on this comparison, automated cluster audit system 102 may associate the value of the system configuration category in display screen 500 with one of a plurality of conformance states. For instance, as illustrated in FIG. 5, CPU column 504, RAM column 506, Swap column 508, Disk column 510, Network Card column 512, Operating System column 514, Patch column 516, Apps column 518, Users column 520, and Cluster S/W column 522 may be presented in red with text designating "Issue," in situations where automated audit cluster system 102 identifies a significant asymmetry for a particular node 104 in relation to the other nodes 104. CPU column 504, RAM column 506, Swap column 508, Disk column 510, Network Card column 512, Operating System column 514, Patch column 516, Apps column 518, Users column 520, and Cluster S/W column 522 may be presented in yellow with the text designating "Warning," in situations where automated audit cluster system 102 identifies there is a potential issue with a node 104 that is worthy of closer examination. CPU column 504, RAM column 506, Swap column 508, Disk column 510, Network Card column 512, Operating System column 514, Patch column 516, Apps column 518, Users column 520, and Cluster S/W column 522 may be presented in green with the text designating "Conforms," in situations where automated audit cluster system 102 identifies that there is internal symmetry for a node 104 or conformity to a predefined set of rules. CPU column 504, RAM column 506, Swap column 508, Disk column 510, Network Card column 512, Operating System column 514, Patch column 516, Apps column 518, Users column 520, and Cluster S/W column 522 may be presented in white with the text designating "Unknown," in situations where automated audit cluster system 102 identifies there is a potential issue with a node 104 that is worthy of closer examination.

IV. Automated Cluster Audit Module

Figure 6:
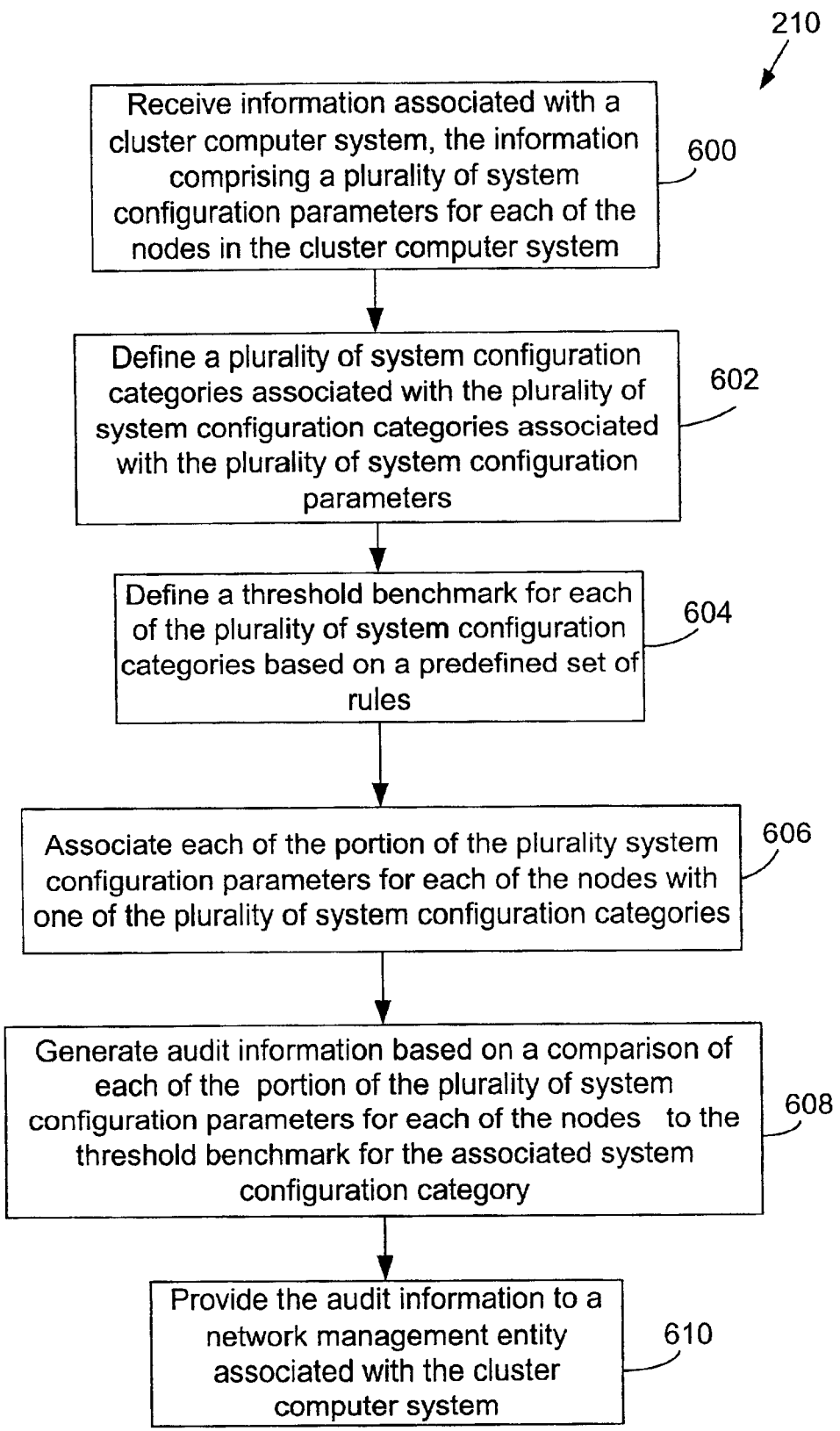
FIG. 6 is a flow chart illustrating the architecture, operation, and/or functionality of one of a number of possible embodiments of the automated cluster audit module of FIGS. 1 and 2.

FIG. 6 is a flow chart illustrating the architecture, operation, and/or functionality of one of a number of embodiments of automated cluster audit module 210 for providing automated diagnostic services for a cluster computer system. At block 600, automated cluster audit module 210 receives information associated with cluster computer system 100. The information may comprise a plurality of system configuration parameters for each node 104 in cluster computer system 100. In general, the system configuration parameters define a snapshot of the configuration of each node 104. For example, the system configuration parameters may include information related to CPU 110, operating system 120, cluster middleware 122, applications 123, disk 124, network interface card(s) 116, I/O device(s) 118, terminals 108, or any other desirable parameter related to the system configuration of node 104.

At block 602, automated cluster audit module 210 defines a plurality of system configuration categories associated with the plurality of system configuration parameters. In one of many possible embodiments, the system configuration categories are defined based on the system configuration parameters that most directly affect the performance of cluster computer system 100. For example, the system configuration categories may include any of the following categories illustrated in cluster audit display 500 of FIG. 5: a central processing unit parameter associated with CPU 110, a random access memory (RAM) parameter associated with RAM (not shown in FIG. 1) in nodes 104, a virtual memory parameter associated with virtual memory, or swap, (not shown in FIG. 1) in nodes 104, a disk parameter associated with disk 124, a network card parameter associated with network card(s) 116, an operating system parameter associated with operating system 120, a patch parameter associated with operating system 120, an applications parameter associated with applications 123, a user parameter associated with clients 108, a cluster middleware parameter associated with cluster middleware 122, or any other desirable parameter associated the various components of nodes 104.

At block 604, threshold benchmarks are defined for each of the plurality of system configuration categories based on a predefined set of rules. As mentioned above with respect to FIG. 3, the threshold benchmarks may be normalized thresholds or fixed thresholds that incorporate a relative ranking process. Where normalized thresholds are implemented, the threshold benchmarks may be defined using a predefined rule that oversees the relative ranking process on a distribution of historical peer-to-peer data. The historical peer-to-peer data may be generated by automated cluster audit system 102. It may also be generated by an external system and provided to automated cluster audit system 102.

As stated above, in certain embodiments, the central ranking distribution system enables automated cluster audit module 210 to adjust the threshold benchmarks. This process of relying upon a central predetermined ranking distribution system for adjusting thresholds overcomes various problems. For example, absolute fixed thresholds are subject to an unpredictable number of unmanaged or ad hoc number of false negatives and false positives. Assuming the benchmarks or heuristic measures are correct, a fixed ranking distribution will produce a controlled percentage of alarms within a fixed population that address the correct categories. Absolute thresholds that are dynamically adjusted with local standards tend to produce confusing results unless time series data samples are gathered over a period of time so that baselining is possible. Manually adjustable thresholds require significant attentive human operator labor to calibrate thresholds to arbitrary values.

A block 606, automated cluster audit module 210 associates each of a portion of the plurality of system configuration parameters for each node 104 with one of the plurality of system configuration categories. At block 608, automated cluster audit module 210 generates audit information based on a comparison of each of the portion of the plurality of system configuration parameters for each node 104 to the threshold benchmark for the associated system configuration category. In situations where the threshold benchmarks incorporate a relative ranking process as illustrated in FIG. 5, the audit information is generated based on a comparison of each of the portion of the plurality of system configuration parameters for each node 104 to the threshold benchmarks for the associated system configuration category At block 610, automated cluster audit module 210 provides the audit information to a network management entity, or similar entity, associated with cluster computer system 100. As described above, the audit information may be provided to cluster computer system 100 and presented in a number of ways. In this regard, automated cluster audit module 210 may configure the audit information in a variety of ways to enable various presentations. In certain embodiments, automated cluster audit module 210 may configure the audit information in such a way that it may subsequently be presented as cluster audit display 500 of FIG. 5.

Figure 7:
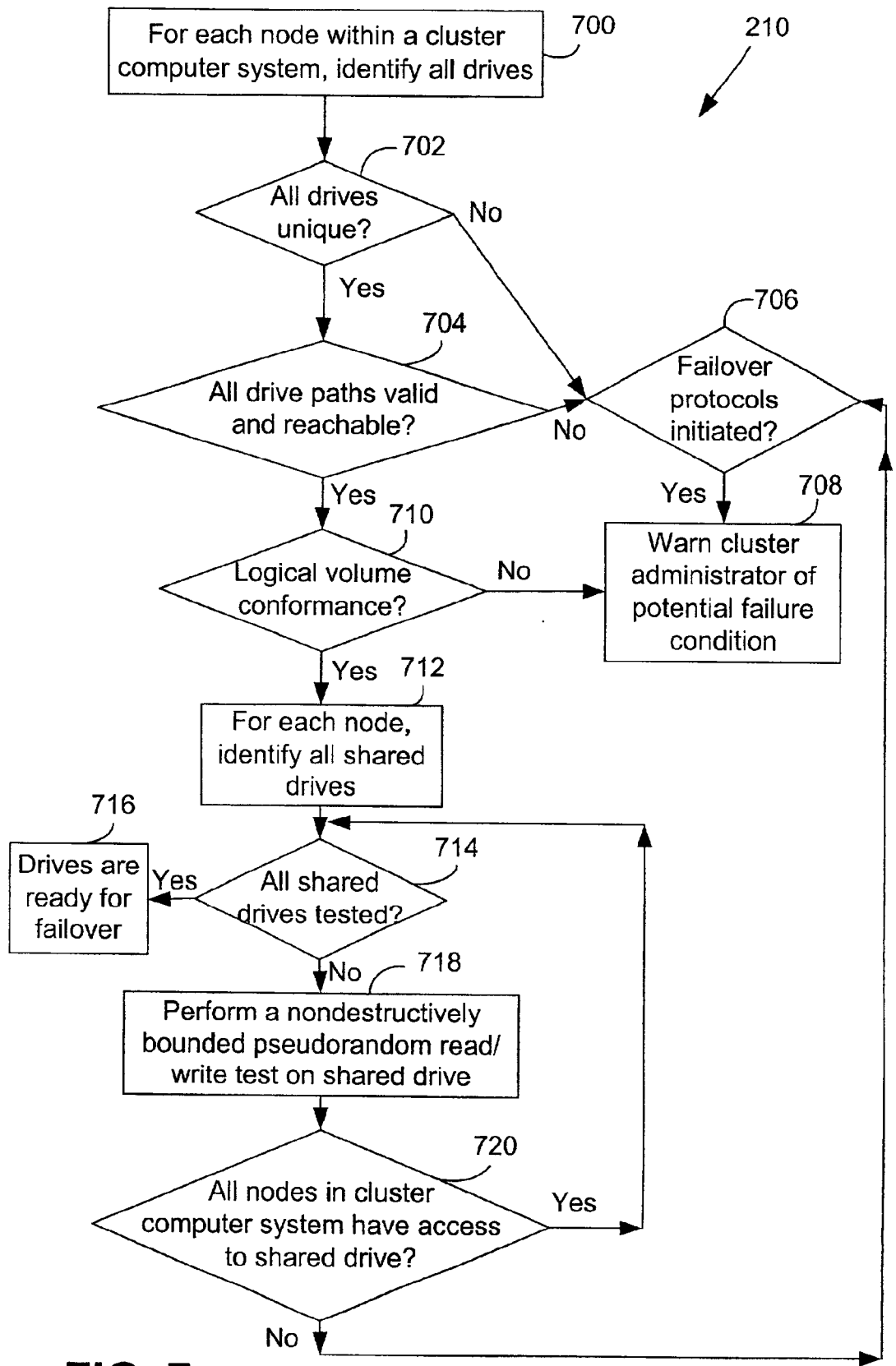
FIG. 7 is a flow chart illustrating the architecture, operation, and/or functionality of another possible embodiment of the automated cluster audit module of FIGS. 1 and 2.

FIG. 7 illustrates the architecture, operation, and/or functionality of another possible embodiment of automated cluster audit module 210 for determining the pre-failover capability of one or more shared storage devices 119, or shared drives, in cluster computer system 100. Unlike existing methods of providing diagnostic audits, automated cluster audit module 210 provides a method for automatically determining whether the shared drives in cluster computer system 100 would transition properly in the event a failover process is initiated. Significantly, automated cluster audit module 210 provides a method for determining the failover capability of a cluster computer system without having to cause a failover by simulating a failover condition.

Referring to FIG. 7, at block 700, automated cluster audit module 210 may identify all drives corresponding to each node in cluster computer system 100. At decision block 702, automated cluster audit module 210 may determine whether all of the drives are unique. For example, automated cluster audit module 210 may determine whether each device driver type and/or instance of the device driver are unique. One of ordinary skill in the art will appreciate that applications 123 and clients 108 see a shared drive from the nodes 104 within cluster computer system 100. The shared drive may be seen through a unique designation, which may comprise a device driver and/or a specific alphanumeric designation for each device under the same drive. Each storage device may have a specific pathway that that may be tested for proper assignment of sequential numbering. This may include tests to prevent erroneous configuration of colliding drive addresses within the same node 104, as well as prevent cluster wide inconsistencies. For instance, colliding device pathways having the same designation within a node 104 or inconsistent device pathways within the cluster computer system 100 may disrupt the ability of a node 104 to share storage device 119 during a failover. If there is a colliding device pathway, the node 104 may be unable to resolve the correct device for access before and after fail-over. Additional tests may be used to confirm that device pathway addressing conventions are sequenced to simplify configuration representations so that they may be easily memorized by service personnel. These tests may look for ways to simplify drive pathway sequencing and reduce discontiguous integers or alphabets in the sequencing. Further tests may verify that the sequencing of the device as designated by the device driver is as uniform as possible between any two nodes 104 within the cluster computing system 100.

If all of the drives are not unique, at block 706, automated cluster audit module 210 determines whether failover protocols have been initiated by cluster computer system 100, in which case, at block 708, automated cluster audit module 210 may provide a warning of a potential failure condition. Depending on the specific implementation of automated cluster audit module 210, the warning may be provided in a number of ways. For example, where automated cluster audit module 210 is implemented within cluster computer system 100 and embodied in cluster middleware 122, cluster data collection module 125, and/or operating system 120, automated cluster audit module 210 may be configured to merely generate the warning. In such instances, the warning may be provided by another module (not shown) to a network management entity, or other entity, associated with cluster computer system 100. In other embodiments, such as where automated cluster audit module 210 is implemented within automated cluster audit system 102, automated cluster audit module 210 may be configured to provide the warning via communications network 126 to cluster computer system 100. In these instances, automated cluster audit module 210 may, but need not, control the provisioning of the warning to the cluster computer system 100. Furthermore, one of ordinary skill in the art will appreciate that the warning may be configured in a number of ways. For example, the warning may be a signal and/or a message that is interpreted by the receiving entity.

If all of the drives are not unique, at decision block 704, automated cluster audit module 210 determines whether all drive paths associated with the drives identified at block 700 are valid and/or reachable. For example, automated cluster audit module 210 may initiate an I/O scan of local cluster interface 106 to determine whether all device paths correlate to valid and/or reachable paths. The I/O scan may be configured to search for new I/O devices that have been recently installed on nodes 104. This may be done by comparing device inventories of previously installed devices to what is presently installed. Thus, automated cluster audit module 210 may compare the internal topology of two nodes 104 by incrementally comparing recent peripheral changes within the node to changes in surrounding nodes.

If all of the drive paths are not valid and/or reachable, at block 708, automated cluster audit module 210 may provide a warning of a potential failure condition as described above. If all of the drive paths are valid and/or reachable, at decision block 710, automated cluster audit module 210 may determine whether a file system associated with the drives in cluster computer system 100 conforms to a predefined set of rules. For instance, cluster computer system 100 may comprise a file system management (or volume management) tool, such as Veritas® File System.

A volume management tool creates a layer of abstraction over the drives in cluster computer system 100. Applications 123, cluster middleware 122, and operating system 120 may use a virtual storage, which is managed using a volume management tool. The volume management software hides the details about where data is stored on the drives within nodes 104 from the cluster computer system 100. By hiding the details about the shared drives, the volume management software separates hardware and software storage management so that it is possible to change the hardware without the software ever noticing. The volume management tool may categorize the drives into storage pools, referred to as logical volume groups. As known in the art, the drives may be hardware devices and/or software devices. A logical volume group may be viewed as a drive from the file system point of view. Each logical volume group may comprise one or more logical volume numbers, which may be viewed as the equivalent of partitions into which the storage space is divided for creating different file systems and raw partitions.

Thus, automated cluster audit module 210 may determine whether the file system associated with the drives in cluster computer system 100 conforms to a predefined set of rules. One of ordinary skill in the art will appreciate that, depending on the particular set of rules applied by the volume management tool, automated cluster audit module 210 may be configured to determine conformance with a variety of sets of rules. For certain types of volume management software, such as Veritas® File System, automated cluster audit module 210 may determine whether the logical volume numbers within each logical volume group are numbered sequentially.

If automated cluster audit module 210 determines that the file system does not conform to the predefined set of rules, at block 708, automated cluster audit module 210 may provide a warning of a potential failure condition as described above. If automated cluster audit module 210 determines that the file system conforms to the predefined set of rules, at block 712, automated cluster audit module 210 may identify all shared drives within cluster computer system 100. The shared drives may be identified in a number of ways, such as by an operating system specific identifier.

As shown in blocks 714, 718, and 720, automated cluster audit module 210 may perform a read/write test on each of the shared drives identified at block 712. For instance, at block 718, automated cluster audit module 210 may perform a read/write test for the shared drive. In a preferred embodiment, the read/write test is a nondestructively bounded pseudorandom read/write test. In one embodiment, the read/write test may be a modified version of a factory read/write test. In this regard, automated cluster audit module 210 may reduce warranty and shipping costs by scheduling as many factory repair certification tests as soon as practical.

At block 720, automated cluster audit module 210 may determine whether each node 104 in cluster computer system 100 can access the particular shared drive. If all nodes 104 have access to the shared drive, the process is repeated at block 714 for the remaining shared drives. If one of the nodes 104 does not have access to the shared drive, at block 708, automated cluster audit module 210 may provide a warning of a potential failure condition as described above.

With reference to FIGS. 8–11, a number of additional embodiments of automated cluster audit module 210 will be described. For instance, automated cluster audit module 210 may be configured to automatically adjust any of a variety of network parameters, or other parameters, related to cluster middleware 122 in order to improve the failover reliability of cluster computer system 100. In general, automated cluster audit module 210 may adjust the network parameter as follows. First, automated cluster audit module 210 may receive a current value of the network parameter related to cluster middleware 122. Second, the automated cluster audit module 210 may analyze the current value of the network parameter relative to a predetermined reference value for the network parameter. One of ordinary skill in the art will appreciate that the predetermined reference values may be determined based on theoretical and/or empirical practices. In one embodiment, the predetermined reference values for dependent variables may be theoretically computed by predetermined formulas and independent values may be compared to a database that contains values that are centrally ranked and managed in an effort to control the number and percentage of alarms. Then, automated cluster audit module 210 may provide information based on the analysis of the current value relative to the predetermined reference value. The information may comprise a warning and/or may comprise an instruction to adjust the network parameter.

Figure 8:
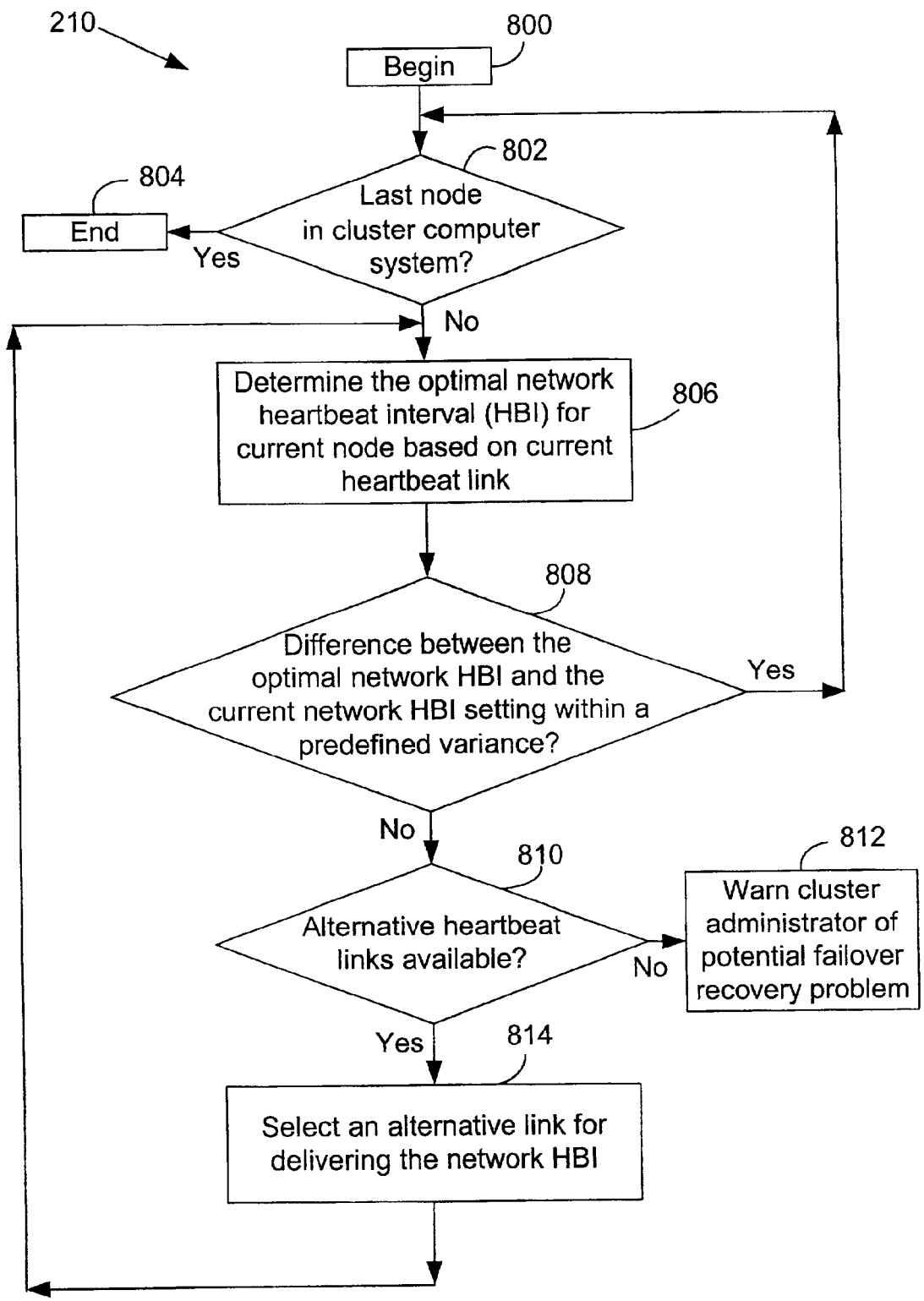
FIG. 8 is a flow chart illustrating the architecture, operation, and/or functionality of yet another possible embodiment of the automated cluster audit module of FIGS. 1 and 2.

FIG. 8 is a flowchart illustrating the architecture, operation, and/or functionality of another embodiment of automated cluster audit module 210 for automatically adjusting the network heartbeat interval (HBI) for one or more nodes 104 in cluster computer system 100. The network HBI refers to a parameter that determines the frequency with which so-called heartbeat signals/messages are sent between nodes 104 in cluster computer system 100.

Referring to FIG. 8, after beginning at block 800, automated cluster audit module 210 may determine, at decision block 802, whether all of the nodes 104 in the cluster computer system 100 have been processed. One of ordinary skill in the art will appreciate that there may be instances in which the network HBI may be adjusted for only one or a portion of the nodes 104 in cluster computer system 100. Nonetheless, when all of the nodes 104 to be processed are in fact processed, the process terminates at block 804. If there are additional nodes 104 to be processed, at block 806, automated cluster audit module 210 determines the optimal network HBI for the current node 104 based on the current heartbeat link. As one of ordinary skill in the art understands, cluster computer system 100 may have one or more communication paths, referred to as heartbeat links, for exchanging heartbeats between nodes 104. The optimal network HBI may be determined based a variety of factors, such as, the heartbeat packet size, the payload throughput of the current heartbeat link, a known or theoretical node-to-node latency time, etc.

At decision block 808, automated cluster audit module 210 may analyze the current value of the network HBI relative to the optimal network HBI. For example, automated cluster audit module 210 may determine whether the difference between the optimal network HBI and the current value is within a predefined variance. For example, in one embodiment, the predefined variance may be approximately one second. If the difference between the current value of the network HBI setting and the optimal network HBI network is within the predefined variance, at block 802, the process is repeated for the other nodes to be process. If the difference is not within the predefined variance, at decision block 810, automated cluster audit module 210 may determine whether there are alternative heartbeat links for the current node for delivering the heartbeat. If an alternative heartbeat link is not available, at block 812, automated cluster audit module 210 may provide a warning of a potential failover recovery problem. If an alternative link is available, at block 814, automated cluster audit module 210, may select an alternative heartbeat link for delivering the heartbeat, which case the process is repeated for the alternative heartbeat link at block 806.

Figure 9:
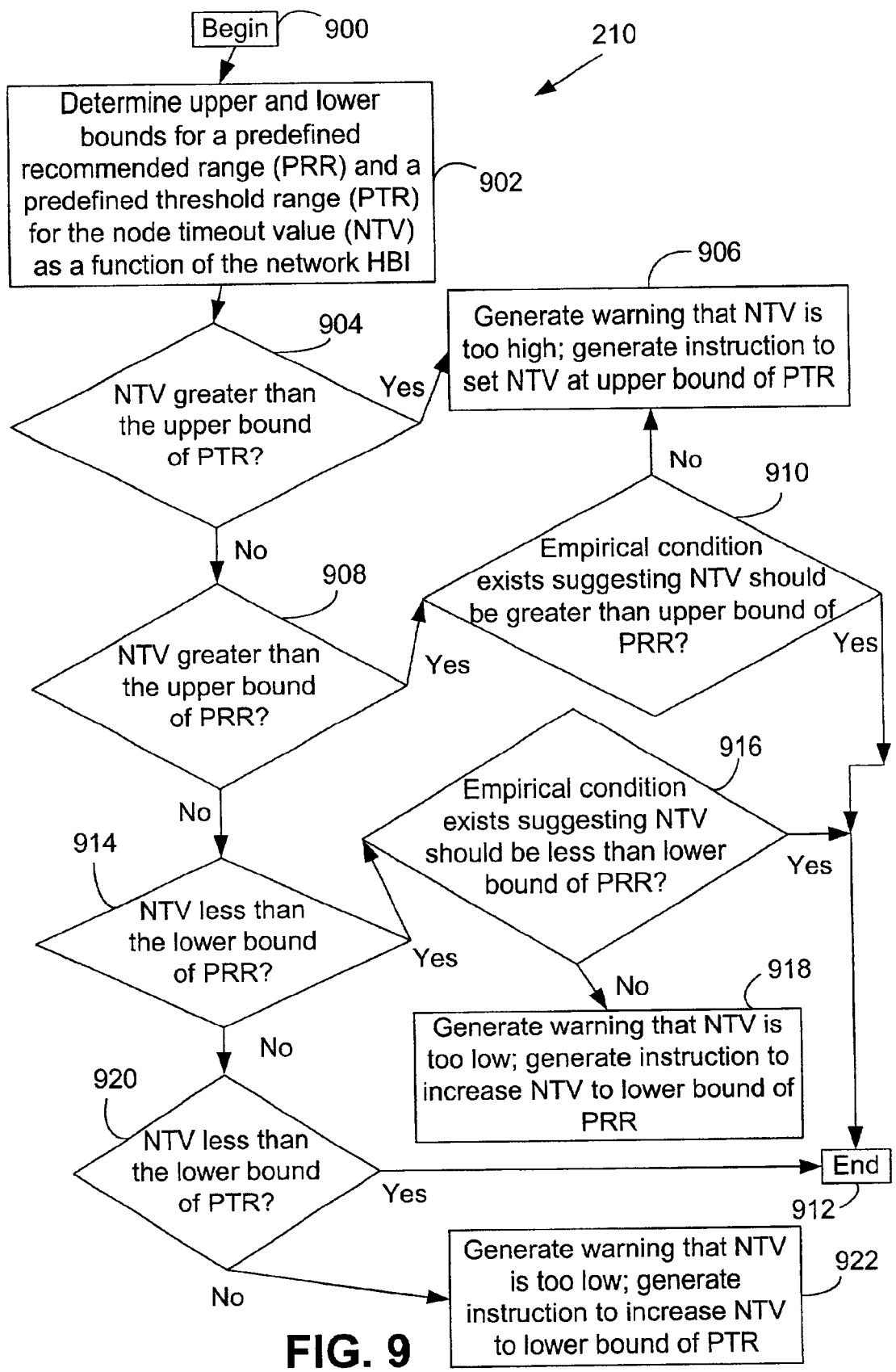
FIG. 9 is a flow chart illustrating the architecture, operation, and/or functionality of yet another possible embodiment of the automated cluster audit module of FIGS. 1 and 2.

FIG. 9 is a flowchart illustrating the architecture, operation, and/or functionality of another embodiment of automated cluster audit module 210 for automatically adjusting the node timeout values (NTV) for one or more nodes 104 in cluster computer system 100. NTV refers to a parameter that determines how long a first node 104 waits for a heartbeat from a second node 104 until reporting that the second node has "timed-out." When a node 104 has timed-out (no heartbeat has been received from the node 104 for the NTV), cluster middleware 122 may initiate a cluster reformation process. Cluster computer system 100 may continue to attempt the cluster reformation process for a period of time referred to as the "failover time." For example, if a node 104 times-out, failover is not necessarily initiated. Rather, the timed-out node 104 may rejoin cluster computer system 100 during the failover time. If the cluster reformation process is not successfully completed in the failover time (the timed-out node 104 does not rejoin the cluster computer system 100), failover may be initiated. Accordingly, the failover time is based in large part on the NTV.

After beginning at block 900, automated cluster audit module 210 may determine, at block 902, upper and lower bounds for a predefined recommended range (PRR) and a predefined threshold range (PTR) for the NTV. The PRR may define a recommended range of values for the NTV and the PTR may define a permissible range of values for the NTV. One of ordinary skill in the art will appreciate that the upper and lower bounds of the PTR and PRR may be predefined based on a variety of factors. In one embodiment, the upper and lower bounds of the PTR and PRR may be based on the following factors: middleware specifications, middleware certification results, expert forum discussion groups, best practices data, and a central ranking statistical database. For example, in another embodiment, the upper and lower bounds of the PTR and PRR may be defined as in Table 1.

TABLE 1

|  | Predefined Recommended Range (PRR) | Predefined Threshold Range (PTR) |
| --- | --- | --- |
| Lower Bound | 5 * (network HBI) | 2 * (network HBI) |
| Upper Bound | 8 * (network HBI) | 30 * (network HBI) |

At decision block 904, automated cluster audit module 210 may determine whether the current value of the NTV for a node 104 is greater than the upper bound of the PTR. If the current value of the NTV is greater than the upper bound of the PTR, automated cluster audit module 210 may provide a warning that the NTV is too high and generate an instruction configured to set the NTV for the node 104 at the upper bound of the PTR. If the current value of the NTV is not greater than the upper bound of the PTR, automated cluster audit module 210 may determine, at decision block 908, whether the NTV for the node 104 is greater than the upper bound of the PRR. If the current value of the NTV is greater than the upper bound of the PRR, automated cluster audit module 210 determine, at decision block 910, whether an empirical condition exists that suggests that the NTV should be greater than the upper bound of the PRR. One of ordinary skill in the art will appreciate that a number of empirical conditions may exist that suggest the NTV should be greater than the upper bound of the PRR. For example, automated cluster audit module 210 may be configured to determine any of the following, or other, conditions: the previous value of the NTV for the node 104 was greater than the lower bound of the PRR, the previous value of the NTV for the node 104 was less than upper bound of the PRR, historical logging demonstrates premature time-out, etc. Conditions that may suggest premature time-out may include the following, as well as others: the historical memory dump for a node 104 contains entries near the top of the stack for a list of uninterruptible kernel, driver, and/or entry points; the start-up log for a node 104 shows consecutive failed attempts to join the cluster and/or a single attempt to join the cluster due to node timeout and failure; a process log suggests significant load on CPU and/or memory resources, etc. If such a condition (or other suggestive condition) exists, at block 912, automated cluster audit module 210 permits the node 104 to operate outside of the PRR and the process terminates at block 912. In alternative embodiments, automated cluster audit module 210 may control how far outside the PRR the node 104 may operate based on the particular suggestive condition. Furthermore, automated cluster audit module 210 may permit a larger variance where multiple suggestive conditions are present. If such a condition (or other suggestive condition) does not exist, automated cluster audit module 210 may provide a warning that the NTV is too high and generate an instruction configured to set the NTV for the node 104 at the upper bound of the PTR.

Referring again to decision block 908, if the current value of the NTV is not greater than the upper bound of the PRR, automated cluster audit module 210 may determine, at decision block 914, whether the NTV is less than the lower bound of the PRR. If the current value of the NTV is less than the lower bound of the PRR, automated cluster audit module 210 may determine, at decision block 916, whether an empirical condition exists that suggests that the NTV should be less than the lower bound of the PRR. One of ordinary skill in the art will appreciate that a number of empirical conditions may exist that suggest the NTV should be less than the lower bound of the PRR. For example, automated cluster audit module 210 may be configured to determine historical symptoms of premature node time-out as described above. If such a condition (or other historical suggestive condition) exists, at block 918, automated cluster audit module 210 permits the node 104 to operate outside of the PRR and the process terminates at block 912. If such a condition (or other suggestive condition) does not exist, automated cluster audit module 210 may provide a warning that the NTV is too low and generate an instruction configured to set the NTV for the node 104 at the lower bound of the PRR.

Referring again to block 914, if the current value of the NTV is not less than the lower bound of the PRR, automated cluster audit module 210 may determine, at decision block 920, whether the NTV is less than the lower bound of the PTR. If the current value of the NTV is less than the lower bound of the PTR, the process may terminate at block 912. If the current value of the NTV is not less than the lower bound of the PTR, automated cluster audit module 210 may provide a warning that the NTV is too low and generate an instruction configured to set the NTV for the node 104 at the lower bound of the PTR.

Figure 10:
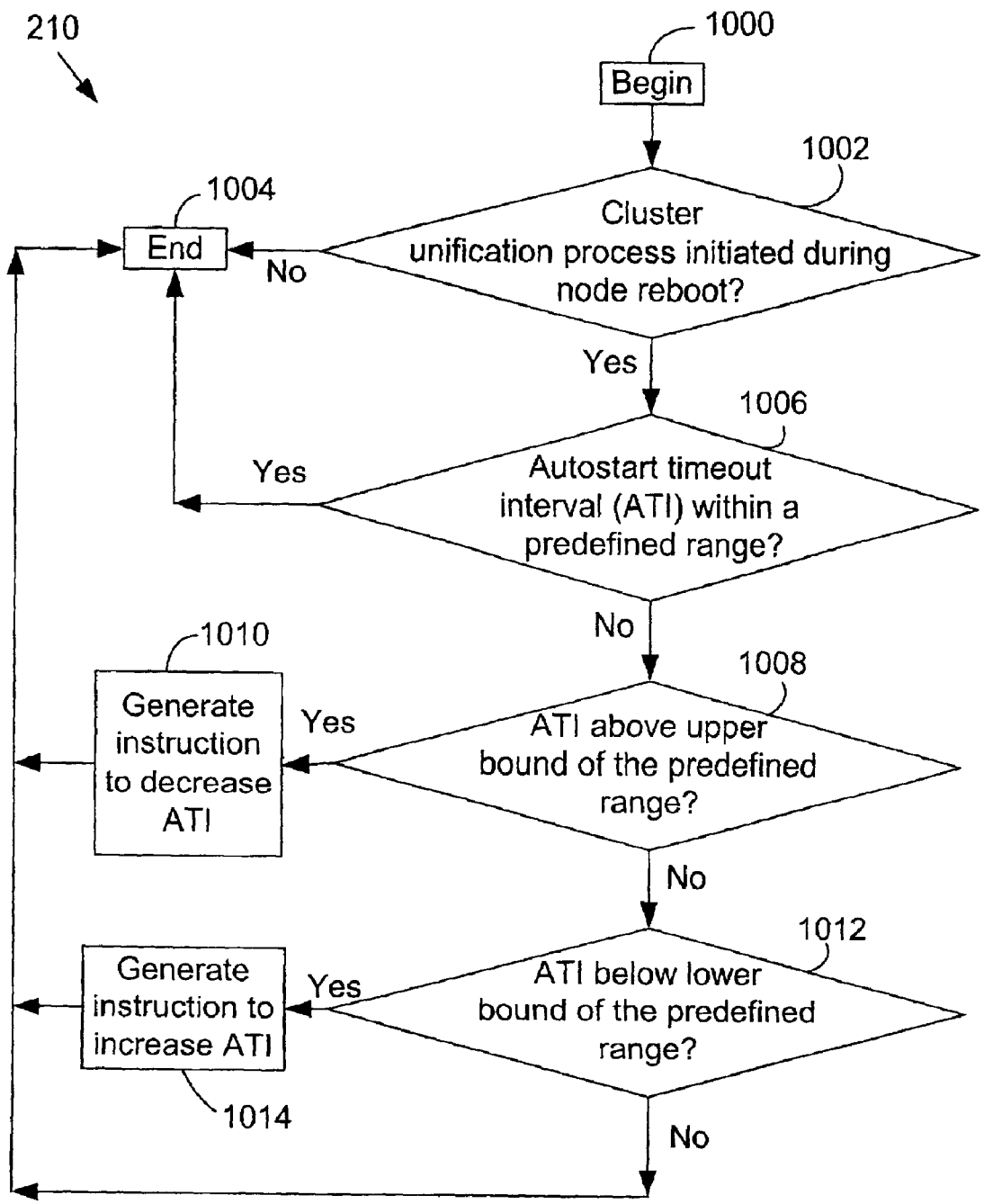
FIG. 10 is a flow chart illustrating the architecture, operation, and/or functionality of yet another possible embodiment of the automated cluster audit module of FIGS. 1 and 2.

FIG. 10 is a flowchart illustrating the architecture, operation, and/or functionality of another embodiment of automated cluster audit module 210 for automatically adjusting the autostart timeout intervals (ATI) for one or more nodes 104 in cluster computer system 100. ATI refers to a parameter that determines how long a node 104 will wait to join the cluster computer system 100 after the node 104 is started.

After beginning at block 1000, at decision block 1002, automated cluster audit module 210 may determine whether a cluster unification process has been initiated during a node reboot. If this condition has not occurred, the process may terminate at block 1004. One of ordinary skill in the art will appreciate that automated cluster audit module 210 may be configured to begin processing after this condition has been detected. For instance, after automated cluster audit module 210 determines that a cluster unification process has been initiated during a node reboot, at decision block 1006, automated cluster audit module 210 may determine whether the current value of the ATI for the node 104 is within a predefined range. If the current value is within the predefined range, the process terminates at block 1004. If the current value is not within the predefined range, at decision block 1008, automated cluster audit module 210 may determine whether the current value of the ATI is above the upper bound of the predefined range. If the current value is above the upper bound of the predefined range, at block 1010, automated cluster audit module 210 may generate an instruction to decrease the ATI for the current node 104. If the current value of the ATI is not above the upper bound, at decision block 1012, automated cluster audit module 210 may determine whether the current value of the ATI is below the lower bound of the predefined range. If the current value is below the lower bound, at block 1014, automated cluster audit module 210 may generate an instruction to increase the ATI for the current node.

Figure 11:
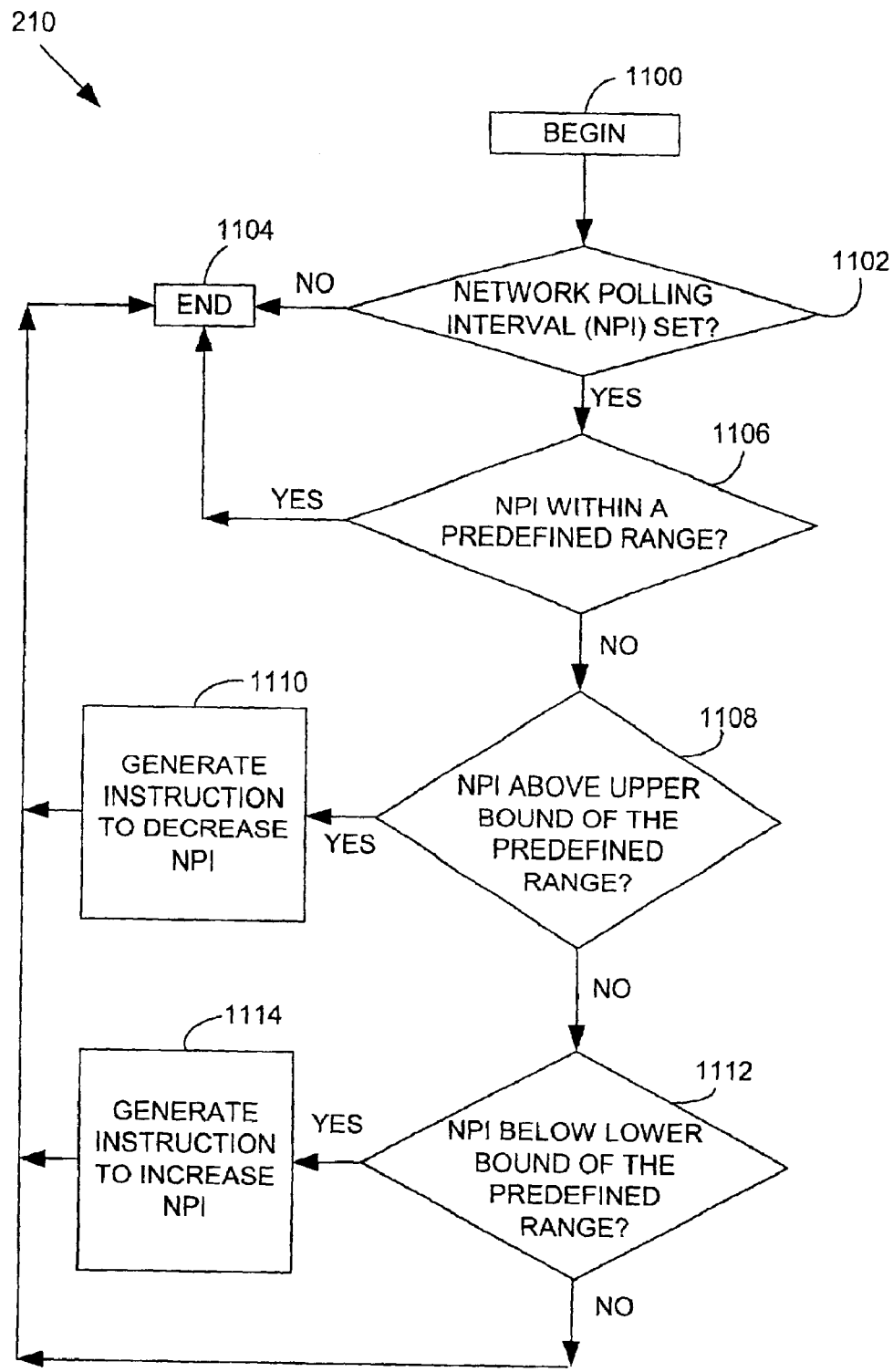
FIG. 11 is a flow chart illustrating the architecture, operation, and/or functionality of yet another possible embodiment of the automated cluster audit module of FIGS. 1 and 2.

FIG. 11 is a flowchart illustrating the architecture, operation, and/or functionality of another embodiment of automated cluster audit module 210 for automatically adjusting the network polling interval for one or more nodes 104 in cluster computer system 100. The network polling interval refers to a parameter that determines the frequency with which a node 104 checks the health of one or more network interfaces associated with the node 104.

After beginning at block 1100, at decision block 1102, automated cluster audit module 210 may determine whether the network polling interval has been set for a node 104. If the network polling interval has not been set, the process may terminate at block 1104. One of ordinary skill in the art will appreciate that automated cluster audit module 210 may be configured to begin processing after this condition has been detected. For instance, after automated cluster audit module 210 determines that a network polling interval has been set for a node 104, at decision block 1106, automated cluster audit module 210 may determine whether the current value of the network polling interval for the node 104 is within a predefined range. If the current value is within the predefined range, the process terminates at block 1104. If the current value is not within the predefined range, at decision block 1108, automated cluster audit module 210 may determine whether the current value of the network polling interval is above the upper bound of the predefined range. If the current value is above the upper bound of the predefined range, at block 1110, automated cluster audit module 210 may generate an instruction to decrease the network polling interval for the current node 104. If the current value of the network polling interval is not above the upper bound, at decision block 1112, automated cluster audit module 210 may determine whether the current value of the network polling interval is below the lower bound of the predefined range. If the current value is below the lower bound, at block 1114, automated cluster audit module 210 may generate an instruction to increase the network polling interval for the current node.

One of ordinary skill in the art will appreciate that automated cluster audit module 210 may be modified to automatically adjust any of a variety of other parameters associated with cluster computer system 100. The embodiments illustrated in FIGS. 8–11, however, are for exemplary purposes only and are not intended to be limiting.

Furthermore, automated cluster audit module 210 may be implemented in hardware, software, firmware, or a combination thereof. As illustrated in FIG. 2, in one of a number of possible embodiments, automated cluster audit module 210 is implemented in software or firmware that is stored in memory and that is executed by processor or any other suitable instruction execution system. If implemented in hardware, as in alternative embodiments, automated cluster audit module 210 may be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Any process descriptions or blocks in FIGS. 3, 4, and 6–11 should be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art.

In addition, the various embodiments of automated cluster audit module 210 and cluster data collection module 125, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

It should be emphasized that the above-described embodiments of cluster data collection module 125 and automated cluster audit module 210, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and protected by the following claims.

What is claimed is:

1. A method for providing automated diagnostic services for a cluster computer system comprising a plurality of nodes, each of the plurality of nodes providing an application to a plurality of clients, the method comprising:

receiving information related to a plurality of drives associated with the plurality of nodes in the cluster computer system, the drives defining one or more logical volume groups;

determining whether the drives conform to a predefined condition related to failover capability based on the information related to the drives, such that the one or more logical volume groups transition in the event of a failover;

determining whether the one or more logical volume groups conform to a predetermined logical volume management condition;

determining whether the logical volume numbers within the one or more logical volume groups are numbered sequentially; and providing a warning if the drives do not conform to the predefined condition.

2. The method of claim 1, wherein receiving information related to a plurality of drives and the step of providing a warning are via a communications network.

3. The method of claim 1, wherein receiving information related to a plurality of drives and the step of providing a warning are performed within the cluster computer system.

4. The method of claim 1, wherein determining whether the drives conform to a predefined condition comprises determining whether the drives are unique.

5. The method of claim 1, wherein determining whether the drives conform to a predefined condition comprises determining whether a plurality of drive paths are valid.

6. A method for providing automated diagnostic services for a cluster computer system comprising a plurality of nodes, each of the plurality of nodes providing an application to a plurality of clients, the method comprising the steps of:

receiving information related to a plurality of drives associated with the plurality of nodes in the cluster computer system, the drives defining one or more logical volume groups;

determining which of the plurality of drives are shared drives;

initiating a read/write test on the shared drives;

determining whether the drives conform to a predefined condition related to failover capability based on the information related to the drives, such that the one or more logical volume groups transition in the event of a failover; and providing a warning if the drives do not conform to the predefined condition.

7. The method of claim 6, wherein the step of initiating a read/write test involves a nondestructively bounded pseudo random read/write test.

8. The method of claim 6, further comprising the step of providing a warning if one of the shared drives fails the read/write test.

9. The method of claim 8, further comprising the step of determining whether each of the plurality of nodes in the cluster computer system can access the shared drives.

10. The method of claim 9, further comprising the step of providing a warning if one of the plurality of nodes in the cluster computer system cannot access one of the shared drives.

11. The method of claim 6, wherein the step of receiving information related to a plurality of drives and the step of providing a warning are via a communications network.

12. The method of claim 6, wherein the step of receiving information related to a plurality of drives and the step of providing a warning are performed within the cluster computer system.

13. The method of claim 6, wherein the step of determining whether the drives conform to a predefined condition comprises determining whether the drives are unique.

14. The method of claim 6, wherein the step of determining whether the drives conform to a predefined condition comprises determining whether a plurality of drive paths are valid.

15. A computer program for providing automated diagnostic services for a cluster computer system comprising a plurality of nodes, each of the plurality of nodes providing an application to a plurality of clients, the computer program, stored on a computer readable storage medium and executing in a computer, comprising:
  a first portion of logic configured to receive information related to a plurality of drives associated with the plurality of nodes in the cluster computer system, the drives defining one or more logical volume groups;
  a second portion of logic configured to determine, based on the information related to the drives, whether the drives conform to a predefined condition related to failover capability such that the one or more logical volume groups transition in the event of a failover, and configured to determine whether the one or more logical volume groups conform to a predetermined logical volume management condition, and further configured to determine whether the logical volume numbers within the one or more logical volume groups are numbered sequentially; and
  a third portion of logic configured to provide a warning if the drives do not conform to the predefined condition.

16. The computer program of claim 15, wherein the first portion of logic is further configured receive the information related to a plurality of drives via a communications network and the third portion of logic is further configured to provide the warning via the communications network.

17. The computer program of claim 15, wherein the first, second, and third portions of logic are embodied in cluster middleware controlling the cluster computer system.

18. The computer program of claim 15, wherein the first, second, and third portions of logic are embodied in an operating system associated with each of the plurality of nodes.

19. The computer program of claim 15, wherein the second portion of logic is further configured determine whether the drives are unique.

20. The computer program of claim 15, wherein the second portion of logic is further configured to determine whether a plurality of drive paths are valid.

21. A computer program for providing automated diagnostic services for a cluster computer system comprising a plurality of nodes, each of the plurality of nodes providing an application to a plurality of clients, the computer program, stored on a computer readable storage medium and executing in a computer, comprising:
  a first portion of logic configured to receive information related to a plurality of drives associated with the plurality of nodes in the cluster computer system, the drives defining one or more logical volume groups;
  a second portion of logic configured to determine, based on the information related to the drives, whether the drives conform to a predefined condition related to failover capability such that the one or more logical volume groups transition in the event of a failover;
  a third portion of logic configured to provide a warning if the drives do not conform to the predefined condition;
  a fourth portion of logic configured to determine which of the plurality of drives are shared drives; and
  a fifth portion of logic configured to initiate a read/write test on the shared drives.

22. The computer program of claim 21, wherein the read/write test is a nondestructively bounded pseudo random read/write test.

23. The computer program of claim 21, further comprising a sixth portion of logic configured to provide a warning if one of the shared drives fails the read/write test.

24. The computer program of claim 23, further comprising a seventh portion of logic configured to determine whether each of the plurality of nodes in the cluster computer system can access the shared drives.

25. The computer program of claim 24, further comprising an eighth portion of logic configured to provide a warning if one of the plurality of nodes in the cluster computer system cannot access one of the shared drives.

26. The computer program of claim 21, wherein the first portion of logic is further configured receive the information related to a plurality of drives via a communications network and the third portion of logic is further configured to provide the warning via the communications network.

27. The computer program of claim 21, wherein the first, second, and third portions of logic are embodied in cluster middleware controlling the cluster computer system.

28. The computer program of claim 21, wherein the first, second, and third portions of logic are embodied in an operating system associated with each of the plurality of nodes.

29. The computer program of claim 21, wherein the second portion of logic is further configured determine whether the drives are unique.

30. The computer program of claim 21, wherein the second portion of logic is further configured to determine whether a plurality of drive paths are valid.

31. A system for providing automated diagnostic services for a cluster computer system comprising a plurality of nodes, each of the plurality of nodes providing an application to a plurality of clients, the system comprising:
  means for receiving information related to a plurality of drives associated with the plurality of nodes in the cluster computer system, the drives defining one or more logical volume groups;
  means for determining which of the plurality of drives are shared drives;
  means for initiating a read/write test on the shared drives;
  means for determining, based on the information related to the drives, whether the drives conform to a predefined condition related to failover capability such that the one or more logical volume groups transition in the event of a failover; and
  means for providing a warning if the drives do not conform to the predefined condition.

32. The system of claim 31, wherein the read/write test involves a nondestructively bounded pseudo random read/write test.

33. The system of claim 31, further comprising a means for providing a warning if one of the shared drives fails the read/write test.

34. The system of claim 33, further comprising a means for determining whether each of the plurality of nodes in the cluster computer system can access the shared drives.

35. The system of claim 34, further comprising a means for providing a warning if one of the plurality of nodes in the cluster computer system cannot access one of the shared drives.

36. A system for providing automated diagnostic services for a cluster computer system, the system comprising a computer having logic configured to:

receive information related to a plurality of drives associated with a plurality of nodes in the cluster computer system, the drives defining one or more logical volume groups;

determine, based on the information related to the drives, whether the drives conform to a predefined condition related to failover capability such that the one or more logical volume groups transition in the event of a failover;

determine whether the logical volume numbers within the one or more logical volume groups are numbered sequentially; and provide a warning if the drives do not conform to the predefined condition.

37. The system of claim 36, wherein the computer is a server.

38. The system of claim 36, wherein the logic is embodied in an operating system associated with the computer.

39. The system of claim 36, wherein the logic is embodied in cluster middleware associated with the computer.

40. The system of claim 36, wherein the computer further comprises a network interface card configured to communicate with a cluster interface.

41. The system of claim 40, further comprising one or more clients in communication with the one or more computers via the cluster interface.

42. The system of claim 36, wherein the computer further comprises a network interface configured to communicate with the cluster computer system via a communications network and wherein the information related to a plurality of drives is received via the communications network and the warning is provided to the cluster computer system via the communications network.

43. The system of claim 36, wherein the logic is further configured to determine whether a plurality of drive paths are valid.

44. The system of claim 36, wherein the logic is further configured to determine whether the one or more logical volume groups conform to a predetermined logical volume management condition.

45. A system for providing automated diagnostic services for a cluster computer system, the system comprising a computer having logic configured to:

receive information related to a plurality of drives associated with a plurality of nodes in the cluster computer system, the drives defining one or more logical volume groups;

determine which of the plurality of drives are shared drives;

initiate a read/write test on the shared drives;

determine, based on the information related to the drives, whether the drives conform to a predefined condition related to failover capability such that the one or more logical volume groups transition in the event of a failover; and provide a warning if the drives do not conform to the predefined condition.

46. The system of claim 45, wherein the logic is configured to provide a warning if one of the shared drives fails the read/write test.

47. The system of claim 46, wherein the logic is further configured to determine whether each of the plurality of nodes in the cluster computer system can access the shared drives.

48. The system of claim 47, wherein the logic is further configured to provide a warning if one of the plurality of nodes in the cluster computer system cannot access one of the shared drives.

49. The system of claim 45, wherein the computer is a server.

50. The system of claim 45, wherein the logic is embodied in an operating system associated with the computer.

51. The system of claim 45, wherein the logic is embodied in cluster middleware associated with the computer.

52. The system of claim 45, wherein the computer further comprises a network interface card configured to communicate with a cluster interface.

53. The system of claim 52, further comprising one or more clients in communication with the one or more computers via the cluster interface.

54. The system of claim 45, wherein the computer further comprises a network interface configured to communicate with the cluster computer system via a communications network and wherein the information related to a plurality of drives is received via the communications network and the warning is provided to the cluster computer system via the communications network.

55. The system of claim 45, wherein the logic is further configured to determine whether a plurality of drive paths are valid.

56. The system of claim 45, wherein the logic is further configured to determine whether the one or more logical volume groups conform to a predetermined logical volume management condition.

57. A method for volume management services for logical volume groups of a cluster computer system, the method comprising:

determining which of the plurality of drives are shared drives;

initiating a read/write test on the shared drives;

receiving information related to a plurality of shared drives associated with a plurality of nodes in the cluster computer system, the shared drives defined by one of the logical volume groups;

determining whether the shared drived conform to a predefined condition related to failover capability; and providing a warning if the shared drives do not conform to the predefined condition.

58. The method of claim 57, further comprising transitioning the shared drive failing to conform to the predefined condition to another logical group.

59. The method of claim 58, wherein the transitioning occurs in the event of a failover.

* * * * *